United States Patent [19]

Burtscher et al.

[11] 3,771,029

[45] Nov. 6, 1973

[54] THYRISTOR WITH AUXILIARY EMITTER CONNECTED TO BASE BETWEEN BASE GROOVE AND MAIN EMITTER

[75] Inventors: Joachim Burtscher; Karl-Peter Frohmader; Alfred Porst; Peter Voss, all of Munich, Germany

[73] Assignee: Siemens Aktiengesellschaft, Berlin and Munich, Germany

[22] Filed: Aug. 15, 1972

[21] Appl. No.: 280,822

[30] Foreign Application Priority Data

Aug. 19, 1971 Germany .................. P 21 41 627.3

[52] U.S. Cl. 317/235 R, 317/235 AB, 317/235 AE, 317/235 AJ

[51] Int. Cl. ......................... H01l 11/00, H01l 15/00

[58] Field of Search .................... 317/235, 41.1, 44, 317/47

[56] References Cited

UNITED STATES PATENTS

| | | | |
|---|---|---|---|
| 3,124,703 | 3/1964 | Sylvan | 317/234 AB |
| 3,409,811 | 11/1968 | Gerlach | 317/235 AB |
| 3,476,989 | 11/1969 | Miles et al. | 317/235 AE |
| 3,549,961 | 12/1970 | Gault | 317/235 AB |
| 3,566,211 | 2/1971 | Svedberg | 317/235 AE |
| 3,577,046 | 5/1971 | Moyson | 317/235 AE |
| 3,586,932 | 6/1971 | Kokosa | 317/235 AB |
| 3,611,066 | 10/1971 | Knaus | 317/235 AB |

*Primary Examiner*—John W. Huckert
*Assistant Examiner*—Andrew J. James
*Attorney*—Benjamin H. Sherman et al.

[57] ABSTRACT

A thyristor wherein a groove is positioned in a base between an auxiliary emitter and a main emitter. The groove causes an increased resistance for current flowing parallel to the upper pn junction when breakover triggering is initiated. Thus, the voltage drops at the pn junction of the auxiliary thyristor so that it is triggered while the voltage at the pn junction of the main thyristor remains below its gating voltage. The load current of the auxiliary thyristor forms a relatively high triggering or gating current for the main thyristor causing it to trigger linearly and/or laminar-like. The auxiliary thyristor is protected from high specific stresses by a fast current transfer onto the main thyristor.

18 Claims, 6 Drawing Figures

THYRISTOR WITH AUXILIARY EMITTER CONNECTED TO BASE BETWEEN BASE GROOVE AND MAIN EMITTER

BACKGROUND OF THE INVENTION

1. Field of the Invention

The invention relates to multi-layer semiconductor devices and more particularly to thyristors that include an auxiliary emitter and means for triggering the auxiliary emitter before the main emitter.

2. Prior Art

A thyristor is a four-layer semiconductor device in which the alternate layers are of opposite conductivity type. The region or layer of n-type conductivity at one end is frequently referred to as the emitter or cathode. The p-type adjacent layer is usually referred to as the base. The layer furthest from the emitter is sometimes referred to as the anode. A source of potential is connected across the device to bias the anode positive relative to the emitter. A trigger or gate electrode is connected to the base, which when energized with a suitable positive signal with respect to the emitter, turns the device on. Although not desirable, the device may also be turned on when a voltage exceeding the forward breakover voltage is applied between the anode and the emitter.

One common thyristor type is a four-layer block or chip of semiconductor material with the emitter diffused into the upper portion of the base as a ring-shaped zone (the emitter layer). This leaves the central upper surface portion of the base within the emitter ring available for forming thereon a gate electrode. An emitter electrode is, of course, provided on the upper surface of the emitter ring. The under surface of the anode conventionally is provided with a conductive film, which serves as the anode electrode.

The conventional thyristor has one particular disadvantage; fast and safe triggering or gating can only be done without problems when the gating current is high. Only then will the gating process start linearly and/or laminar-like. It is desirable, however, for a thyristor to be gated by a low gating current, due to the cost of a control circuit. If a low gating current is fed into the control path of a conventional thyristor, a small, usually dot-shaped zone is activated intially. This dot-shaped zone must carry the entire load current and thus is subjected to a high specific stress. In turn, this causes overheating and destruction of the member in the spherical or dot-shaped zone. Therefore, it has been proposed that an auxiliary emitter be positioned between the main emitter and the gate electrode and that the auxiliary emitter be electrically connected to the base. Such arrangement was intended to rapidly and safely gate the thyristor even with low control current. This auxiliary emitter has the effect of forming an auxiliary thyristor with the two base layers and the second emitter (anode). The auxiliary thyristor will be gated first. The load current of the auxiliary thyristor will flow via the base toward the main thyristor and gate it. The auxiliary emitter is dimensioned in such a way that the load current of the auxiliary thyristor causes a linear or laminar-like gating of the main thyristor initially. When the main thyristor is gated, the load current will only flow through the latter and the auxiliary thyristor will become extinguished.

The gating of the auxiliary thyristor before gating the main thyristor is assured with the above described thyristor only when the gating current for the thyristor flows via the gate electrode. This, however, is not always the case. As is well known, a thyristor can also be gated by an applied "breakover" voltage. This type of gating is obtained when the applied voltage exceeds the breakover voltage. In other words, when an applied voltage exceeds the breakover voltage of the thyristor, the thyristor switches from a blocking condition to a conducting condition, even if the control voltage is zero. However, there is no assurance that a breakover gating will cause the auxiliary thyristor to trigger first. Thus, if the main thyristor gates first, it will be triggered in a small dot-shaped portion and the thryistor will be destroyed since the current density is relatively high in such small portions.

SUMMARY OF THE INVENTION

The present invention provides a novel arrangement of a thyristor employing an auxiliary emitter so that ignition always takes place in the auxiliary thyristor ahead of the main thyristor when the breakover voltage is exceeded.

It is a novel feature of the invention to provide a groove in a base of the above described thyristor between the auxiliary emitter and the main emitter and electrically connect such auxiliary emitter with the base at a point thereof between the groove and the main emitter.

It is a further novel feature of the invention to place a material in the above mentioned groove composed of a material selected from the group consisting of insulating materials and semiconductor materials of the same conductivity type as that of the auxiliary emitter.

It is a further feature of the invention to provide an area adjacent to the groove and located between the groove and the main emitter composed of a semiconductor material of the same conductivity type as that forming the auxiliary emitter.

DETAILED DESCRIPTION OF PREFERRED EMBODIMENTS

Figure 1A:
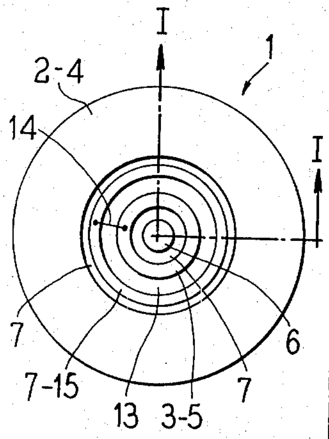
FIG. 1*a* is a plan view of a thyristor embodying the principles of the invention.

In the drawings, similar reference numerals denote similar elements. FIG. 1*a* shows a top plan view of an exemplary thyristor 1 in the form of a circular or disc-like chip having annular regions 2–4, 7, 15–7, 13, 3–5, 7 and 6, respectively, with a bridging connection 14 electrically connecting regions 3–5 and 15–7. Of course, additional bridging connections may be provided.

Figure 1:
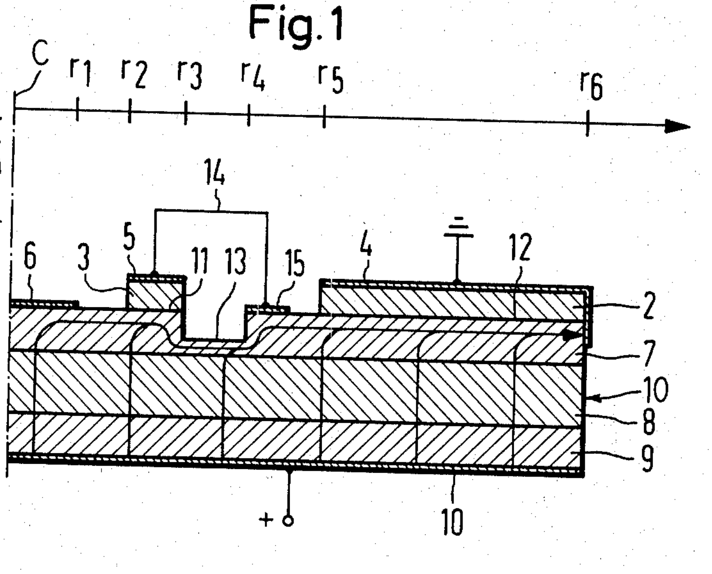
FIG. 1 is an elevated sectional view taken along lines I—I of FIG. 1*a;*

As shown at FIG. 1, a thyristor comprises a semiconductor member 10 having at least four layers or regions 2–3, 7, 8 and 9 of respective opposite conductivity type. By way of example, the semiconductor member 10 may be formed of silicon with an n-type main emitter 2 and an auxiliary emitter 3 spaced therefrom as a first layer, a p-type base 7 as a second layer, an n-type layer 8 below the base layer 7 and a bottom p-type layer 9. The emitter 2 is provided with an electrode 4, which contacts the emitter 2 along its upper surface and, in the embodiment shown, extends over an edge remote from auxiliary emitter 3. The portion of electrode 4 which extends over the outer edge of emitter 2 is of sufficient length to form an electrical contact with the outer edge of base 7. The auxiliary emitter 3 is provided with an electrode 5. As shown, the auxiliary emitter 3 is spaced from the main emitter 2. Bottom layer 9, sometimes referred to as a second emitter, is provided with an electrode 10, which may, for example, be composed of molybdenum. The electrode 10 is arranged to be connected to a source of positive potential while electrode 4 is arranged to be connected to ground, for example.

A gate or trigger electrode 6 is formed as an electrical contact for the central region of base 7. The base 7 is provided with a groove 13 located between the auxiliary emitter 3 and the main emitter 2. The auxiliary emitter 3 is electrically connected to the base 7 at a point thereof located between the groove 13 and the main emitter 2. In the embodiment shown, an electrode 15 is located on base 7 adjacent the groove 13 and opposite or across from the auxiliary emitter 3. An electrical conduit 14 electrically connects the electrode 5 of the auxiliary emitter 3 with the electrode 15 and thus with base 7. The pn junction between the auxiliary emitter and the base 7 is designated 11 and the pn junction between the main emitter 2 and the base 7 is designated 12.

The exemplary thyristor form shown is of a disc-like chip or block having a center C and a radius $r_6$. As will be appreciated, the thyristor may be of other forms than that illustrated.

In explaining the operating mode of the device, it will be assumed that electrode 10 is located on a positive potential and electrode 4 on a zero potential. When an applied voltage exceeds the breakover voltage of a thyristor (no control current), a current is created by charge-carrier multiplication (avalanche breakdown) and flows along a path marked by the arrows from electrode 10 to electrode 4. The current flows just below and parallel to the pn junctions 11 and 12 because the impurity or doping concentration is highest at the border region of the base 7 and the charge-carriers thus find the lowest resistance along this region.

Figure 2:
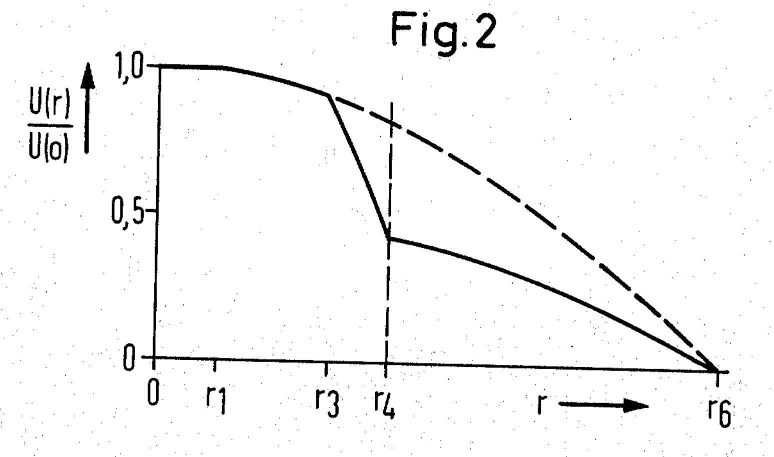
FIG. 2 is a graph illustrating the relation between the potential distribution at the upper border of the base of a thyristor and the radius thereof.

As shown in FIG. 2, the potential distribution below the pn junctions 11 and 12 is dependent on the radius. The reference point for the voltage is potential U (o) of base 7 at a zero radius located below the gate electrode 6. As is obvious from FIG. 1, a current flowing parallel to the pn junctions 11 and 12 encounters an increased resistance in base 7 below groove 13. Accordingly, a relatively large voltage decrease will occur below groove 13. Electrode 15 is electrically connected to electrode 5 via conduit 14 but is located on the potential that is prevalent on the right side of groove 13. Accordingly, the auxiliary thyristor, formed by auxiliary emitter 5 and the layers thereunder is thus triggered prior to the main thyristor, formed by main emitter 2 and the layers thereunder. Generally, the auxiliary emitter is highly doped and thus has substantially the same potential as electrode 15.

Figure 3:
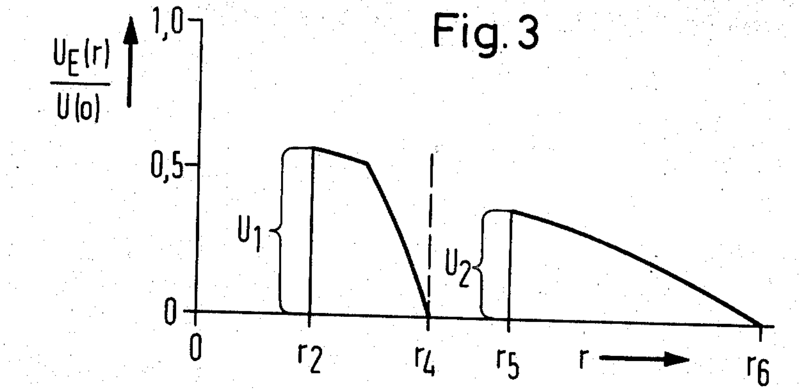
FIG. 3 is a graph of the voltage at the pn junctions between the main emitter and the adjacent base zone and between the auxiliary emitter and the adjacent base zone as a function of emitter radius.

In the graph illustrated at FIG. 3, the voltage distribution at pn junction 11 below the auxiliary emitter 3 and at the pn junction 12 below the main emitter 2 are shown as a function of radius. Again the voltages are normalized to potential U (o) at a zero radius in base 7 below gate electrode 6. The voltage which decreases at the left edge of pn junction 11 is designated $U_1$ and the voltage which decreases at the left edge of pn junction 12 designated $U_2$. As shown, the amplitude of voltage $U_1$ is larger than that of voltage $U_2$. Accordingly, the auxiliary thyristor is always triggered first. The voltage at pn junction 12 of the main thyristor remains lower than the voltage required to trigger or gate the thyristor.

When the auxiliary thyristor is triggered, its load current flows via electrode 5, conduit 14 and electrode 15 into base 7 and to emitter 2 of the main thyristor. The load current of the auxiliary thyristor forms a strong control current for the main thyristor so that the latter will be triggered linearly or laminar-like. An overload of the main thyristor is thus avoided. The auxilary thyristor cannot be overloaded since the current transfer to the auxiliary thyristor takes place very quickly. The auxiliary thyristor extinguishes after the main thyristor has been triggered.

The auxiliary thyristor's ability to trigger, i.e., the decrease of voltage at pn junction 11 is regulated by the width and/or depth of groove 13. The voltage decrease at pn junction 11 is also dependent on the doping concentration in base 7. In exemplary embodiments, the width of groove 13 is preferably in the range of about 1 to 5 mm and the depth is preferably in the range of about the range of 10 to 40 $\mu$ m. The border impurity or dopant concentration in base 7 is preferably about $10^{18}$ cm$^{-3}$. The width of the auxiliary emitter 3 (from radius $r_2$ to $r_3$ of FIG. 1) is, for example, 5 mm. These values are not absolute and may vary as desired.

Figure 4:
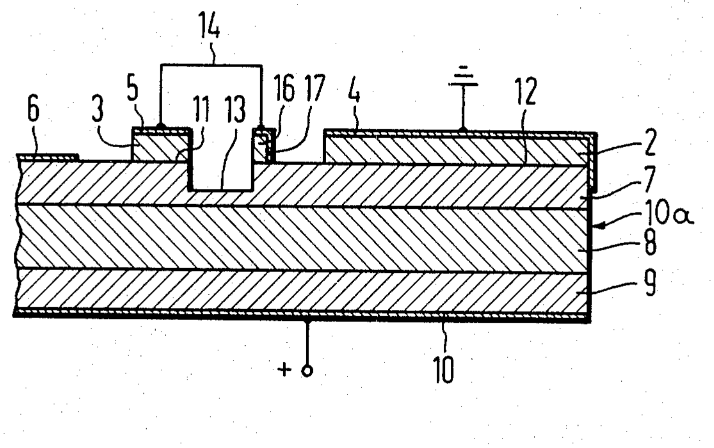
FIG. 4 is a fragmentary sectional view of a modified form of a thyristor embodying the principles of the invention.

FIG. 4 illustrates another embodiment of the invention, which comprises a semiconductor device **10*a* wherein similar elements to those shown at FIG. 1 are designated with the same reference numerals. Semiconductor device 10*a* differs from device 10 of FIG. 1 by the inclusion of an area 16 adjacent groove 13 and located between the main emitter 2 and the groove 13, such as a ring-shaped area in the exemplary disc-form thyristor discussed earlier. Area 16 is composed of semiconductor material of the same conductivity type as that of the auxiliary emitter 3. The area 16 is provided with an electrically conductive coating 17, which electrically contacts area 16 with base 7. The conductive coating 17 is also electrically connected to the electrode 5 of the auxiliary emitter 3 via conduit 14 so as to provide an electrical connection between the auxiliary emitter 3 and the base 7. The invention encompasses thyristor embodiments without areas such as 16**.

Figure 5:
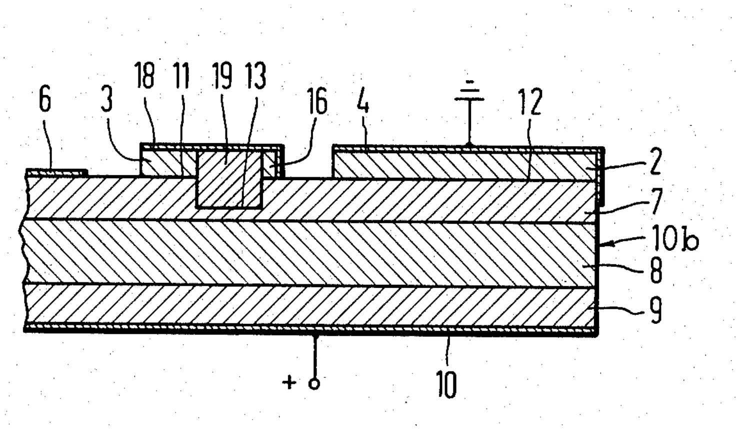
FIG. 5 is a fragmentary sectional view of another modified form of a thyristor embodying the principles of the invention.

FIG. 5 illustrates a further exemplary embodiment of the invention. Again similar elements to those shown at FIG. 1 are designated with the same reference numerals. A semiconductor device **10*b* differs from the devices 10 or 10*a* of FIGS. 1 and 4 by the inclusion of a conductive coating 18 that extends across groove 13**.

This obviates the necessity for a conduit for interconnecting the auxiliary emitter with a point of the base located between the groove and the main emitter. In the embodiment shown, groove 13 is provided or filled with a material 19 which is selected from the group consisting of insulating materials and semiconductor materials of the same conductivity type as that of auxiliary emitter 3. An advantage of this embodiment is that conductive coating 18 is supported over the width of groove 13. During fabrication, the conductive coating 18 is applied or positioned after the formation of groove 13. In embodiments utilizing material 19, coating 18 is applied after such material has been positioned within the groove.

The mode of operation for the invention was explained with conditions wherein a thyristor is triggered by the application of a voltage which exceeds the breakover voltage. The same mode of operation is achieved when a voltage in the form of a pulse having a steep slope is applied to the main path of a thyristor. The only difference is that the current causing the triggering or gating is a displacement current created by capacitants of the blocking pn junction.

As is apparent from the foregoing specification, the present invention is susceptible of being embodied with various alterations and modifications which may differ from those that have been described in the preceding specification and description. For example, the thyristors may be formed in different configurations, such, for instance, as a planar-type thyristor having windows in the base for the auxiliary and main emitters, etc., different groove configurations, etc. For this reason, it is to be fully understood that all of the foregoing is intended to be merely illustrative and is not to be construed or interpreted as being restricted or otherwise limiting of the present invention, excepting as is set forth and defined in the hereto appendant claims.

We claim as our invention:

1. A thyristor comprising a semiconductor member with at least four zones of alternate conductivity type, a first zone being a main emitter and an auxiliary emitter spaced from each other, and a second zone being a base, said main emitter having an electrode thereon and said base having a gate electrode thereon, said auxiliary emitter being positioned between said main emitter and said gate electrode, said base having a groove located between said auxiliary emitter and said main emitter, said auxiliary emitter being electrically connected with said base at a point thereof located between said groove and said main emitter.

2. A thyristor as defined in claim 1, wherein said groove is filled with an insulating material.

3. A thyristor as defined in claim 2 including an area adjacent said groove and located between said groove and said main emitter composed of a semiconductor material of the same conductivity type as that forming said auxiliary emitter.

4. A thyristor as defined in claim 2 wherein said auxiliary emitter is provided with a conductive coating that extends across but spaced above said groove and electrically connects said auxiliary emitter with said base at a point thereof located between said groove and said main emitter.

5. A thyristor as defined in claim 2 wherein said auxiliary emitter is electrically connected with said base by an electrical conduit extending across but spaced above said groove.

6. A thyristor as defined in claim 1 wherein said groove is filled with a semiconductor material of the same conductivity type as that forming said auxiliary emitter but which filled material is without electrical connection to any other part of said thyristor.

7. A thyristor as defined in claim 6 including an area adjacent said groove and located between said groove and said main emitter composed of a semiconductor material of the same conductivity type as that forming said auxiliary emitter.

8. A thyristor as defined in claim 6 wherein said auxiliary emitter is provided with a conductive coating that extends across but space above said groove and electrically connects said auxiliary emitter with said base at a point thereof located between said groove and said main emitter.

9. A thyristor as defined in claim 6 wherein said auxiliary emitter is electrically connected with said base by an electrical conduit extending across but space above said groove.

10. A thyristor as defined in claim 1 including an area adjacent said groove and located between said groove and said main emitter composed of a semiconductor material of the same conductivity type as that forming said auxiliary emitter.

11. A thyristor as defined in claim 10 wherein said auxiliary emitter is provided with a conductive coating that extends across but spaced above said groove and electrically connects said auxiliary emitter with said base at a point thereof located between said groove and said main emitter.

12. A thyristor as defined in claim 10 wherein said auxiliary emitter is electrically connected with said base by an electrical conduit extending across but spaced above said groove.

13. A thyristor as defined in claim 1 wherein said auxiliary emitter is provided with a conductive coating that extends across but spaced above said groove and electrically connects said auxiliary emitter with said base at a point thereof located between said groove and said main emitter.

14. A thyristor as defined in claim 1 wherein said auxiliary emitter is electrically connected with said base by an electrical conduit extending across but spaced above said groove.

15. A thyristor comprising a semiconductor member having a plurality of zones with adjacent zones being of opposite conductivity type, a gate electrode attached to one of said zones, a main emitter attached to said one of said zones remotely from said gate electrode and an auxiliary emitter attached to said one of said zones between said gate electrode and said main emitter, said one of said zones having a groove between said auxiliary emitter and said main emitter, said auxiliary emitter being electrically connected with said one of said zones at a point thereof located between said groove and said main emitter.

16. A thyristor as defined in claim 7 wherein said groove has a width in the range of about 1 to 5 mm.

17. A thyristor as defined in claim 7 wherein said groove has a depth in the range of 10 to 40 $\mu$ m.

18. A thyristor as defined in claim 7 wherein said groove is filled with a material selected from the group consisting of insulating materials and semiconductor materials of the same conductivity type as that forming said auxiliary emitter.

* * * * *